United States Patent
Hickle

(10) Patent No.: US 12,015,388 B2
(45) Date of Patent: Jun. 18, 2024

(54) BROADBAND MICROWAVE AND MILLIMETER-WAVE BALANCED-TO-UNBALANCED TRANSFORMER

(71) Applicant: BAE Systems Information and Electronic Systems Integration Inc., Nashua, NH (US)

(72) Inventor: Mark D. Hickle, Merrimack, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 17/333,163

(22) Filed: May 28, 2021

(65) Prior Publication Data

US 2022/0385261 A1    Dec. 1, 2022

(51) Int. Cl.
  *H03H 7/42*     (2006.01)
  *H01P 5/16*     (2006.01)

(52) U.S. Cl.
  CPC ........... *H03H 7/42* (2013.01); *H01P 5/16* (2013.01)

(58) Field of Classification Search
  CPC .......... H03H 7/42; H03H 7/422; H03H 7/425; H03H 7/427; H01P 5/16
  See application file for complete search history.

(56) References Cited

U.S. PATENT DOCUMENTS

| | | | |
|---|---|---|---|
| 5,148,130 A | 9/1992 | Dietrich | |
| 2005/0088252 A1* | 4/2005 | Burns | H05K 1/0239 333/26 |
| 2008/0113643 A1* | 5/2008 | Guan | H03D 7/1433 333/25 |
| 2014/0253246 A1* | 9/2014 | Mei | H03F 1/42 330/295 |
| 2022/0069794 A1* | 3/2022 | Tsukashima | H03H 7/0153 |

OTHER PUBLICATIONS

Oh, et al., "A Better Balun? Done!," IEEE Microwave Magazine, vol. 18, No. 1, Jan./Feb. 2017. pp. 85-90.
(Continued)

*Primary Examiner* — Patrick C Chen
(74) *Attorney, Agent, or Firm* — Finch & Maloney PLLC; Gary McFaline

(57) ABSTRACT

Techniques are provided for a broadband microwave/millimeter-wave balanced-to-unbalanced transformer (balun). A balun implementing the techniques according to an embodiment includes a first impedance matching network configured to reduce insertion and return losses of a single-ended signal at a first port of the balun. The balun also includes a first planar bifilar coupled transmission line coupled to the first impedance matching network and configured to transform the single-ended signal into a differential signal. The balun further includes a second planar bifilar coupled transmission line coupled to the first bifilar coupled transmission line and configured to compensate for amplitude and phase imbalance induced on the differential signal by the first bifilar coupled transmission line. The balun further includes (Continued)

a second impedance matching network coupled to both planar bifilar coupled transmission lines and configured to reduce insertion and return losses of the differential signal at second and third ports of the balun.

17 Claims, 6 Drawing Sheets

(56) References Cited

OTHER PUBLICATIONS

Yoon, et al., "A Silicon Monolithic Spiral Transmission Line Balun with Symmetrical Design," IEEE Electron Device Letters, vol. 20, No. 4, Apr. 1999. pp. 182-184.

Chakraborty, et al., "A 30-60 GHz SiGe transformer balun with offset radii coils for low amplitude and phase Imbalance," IEEE MTT-S International Microwave Symposium (IMS), 2017. pp. 1278-1281.

Meharry, David E., "Decade Bandwidth Planar MMIC Balun," Downloaded, Mar. 11, 2021, IEEE Xplore. pp. 1153-1156.

Poddar, et al., "A Novel UWB Balun: Application in 5G Systems," IEEE International Frequency Control Symposium (IFCS), 2016. pp. 1-7.

Marki Microwave, "MMIC 14-40GHz Isolation Balun," May 2018. 7 pages.

Mini-Circuits, "MMIC Balun, RF Transformer Die," Feb. 2020. 4 pages.

\* cited by examiner

Balun transfer function and banwidth
300

320

360

Planar bifilar coupled transmission lines
220, 230

BROADBAND MICROWAVE AND MILLIMETER-WAVE BALANCED-TO-UNBALANCED TRANSFORMER

STATEMENT OF GOVERNMENT INTEREST

This invention was made with United States Government assistance under Contract No. FA8650-17-C-7709, awarded by the United States Government. The United States Government has certain rights in this invention.

FIELD OF DISCLOSURE

The present disclosure relates to balanced-to-unbalanced transformers (baluns), and more particularly, to baluns that provide high bandwidth at microwave and millimeter-wave frequencies.

BACKGROUND

A balun is a 3-port device which accepts a single-ended signal as an input through a first port and generates a pair of differential output signals at the two other ports. The differential outputs are ideally equal in amplitude and 180 degrees out-of-phase. The balun is a reciprocal device in that it can also accept a pair of differential signals as an input and generate a single-ended signal as an output while rejecting common-mode signal components. At lower frequencies, baluns typically employ magnetically coupled transformers. The transformer core materials, however, have material properties which make them unsuitable for operation at frequencies above approximately two gigahertz (GHz). Some baluns, which are capable of operating at higher frequencies, use distributed structures or coupled inductors without ferrite cores. These types of baluns, however, are generally narrowband devices that provide fractional bandwidths of less than three-to-one (the ratio of maximum frequency to minimum frequency is less than 3:1), making them also unsuitable for many applications.

Figure 1:
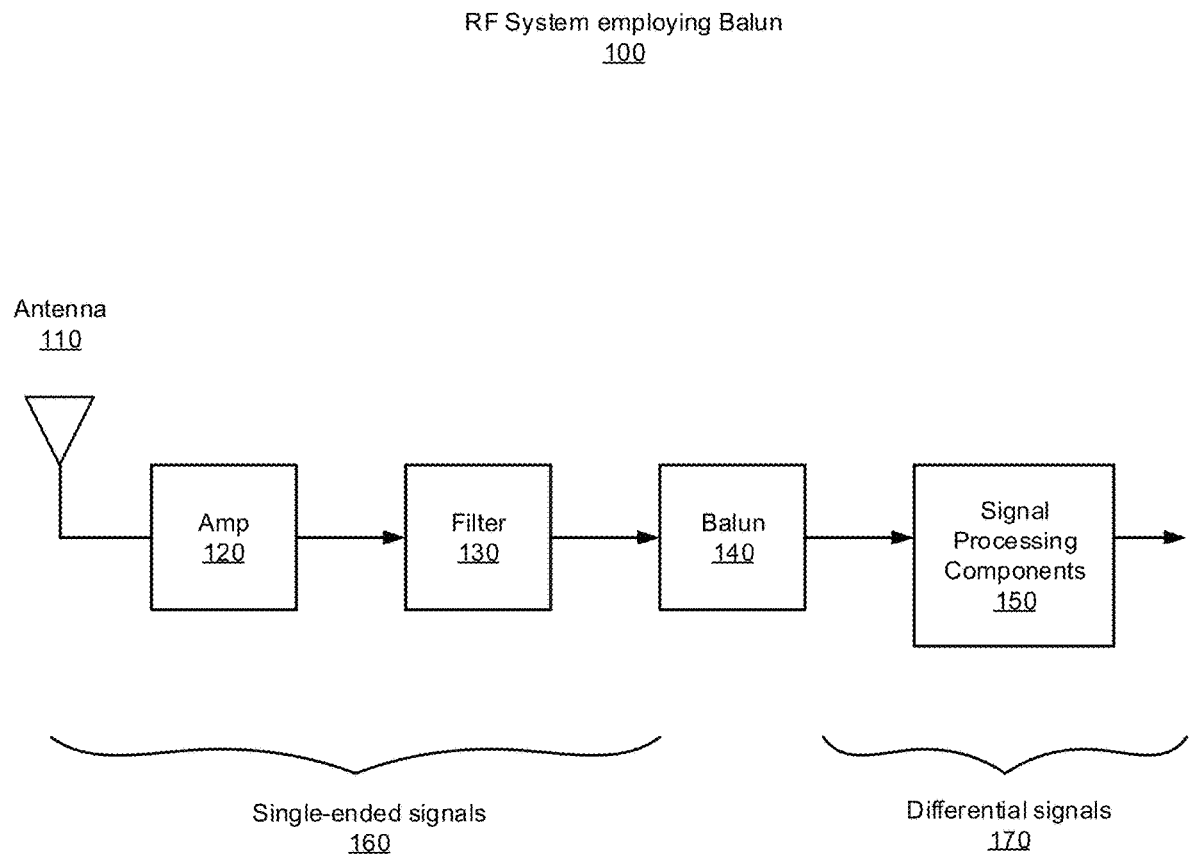
FIG. 1 illustrates a radio frequency (RF) system employing a balun, in accordance with certain embodiments of the present disclosure.

Although the following Detailed Description will proceed with reference being made to illustrative embodiments, many alternatives, modifications, and variations thereof will be apparent in light of this disclosure.

DETAILED DESCRIPTION

Techniques are provided herein for the design and fabrication of a balun that provides high bandwidth at microwave and millimeter-wave frequencies (e.g., greater than approximately 1 GHz, for microwave frequencies, and greater than approximately 30 GHz, for millimeter-wave frequencies). As noted previously, baluns are devices that transform single-ended signals into differential signals, and vice versa. Baluns can be used, for example, in RF systems where both types of signals (single-ended and differential) are present. Differential signals provide performance benefits (e.g., rejecting common-mode noise and even-order distortion), but some types of RF components, such as amplifiers, filters, and antennas are not necessarily compatible with differential signals, and so there is a need to convert a given differential signal to a single-ended signal and vice versa. Existing baluns, however, are either limited to operation at lower frequencies, generally below 2 GHz, or they suffer from narrow bandwidth characteristics (e.g., less than a 3:1 ratio of maximum frequency to minimum frequency).

To this end, and in accordance with an embodiment of the present disclosure, a balun circuit is disclosed which provides relatively high fractional bandwidth (e.g., $f_{max}/f_{min}$ greater than 10:1) at microwave and millimeter-wave frequencies, and relatively low insertion loss (e.g., less than 3 dB) for improved signal sensitivity. In one such example embodiment, this is accomplished with the use of two, serially coupled, planar bifilar coupled transmission lines, along with impedance matching networks, as will be explained in greater detail below. A planar bifilar coupled transmission line comprises two conductive transmission lines (e.g., spiral coils or windings) closely spaced to one another (e.g., less than a micrometer), as will also be explained below. The first bifilar coupled transmission line is employed to transform signals between single-ended and differential modes, while the second bifilar coupled transmission line is used to compensate for any amplitude and phase imbalance that is induced by the first bifilar coupled transmission line.

The disclosed balun circuit can be used in a wide variety of applications including, for example, radar systems and communication systems that can be deployed on aircraft (manned and unmanned), guided munitions and projectiles (lethal and non-lethal), space-based systems, electronic warfare systems, cellular telephones, and smartphones, although other applications will be apparent. In a more general sense, the disclosed techniques are useful for any systems in which high frequency and high bandwidth signals are received, transmitted, or processed. In accordance with an embodiment, a balun includes a first impedance matching network configured to reduce insertion and return losses of a single-ended signal at a first port of the balun. The balun also includes a first planar bifilar coupled transmission line coupled to the first impedance matching network and configured to transform the single-ended signal into a differential signal. The balun further includes a second planar bifilar coupled transmission line coupled to the first planar bifilar coupled transmission line and configured to compensate for amplitude and phase imbalance induced on the differential signal by the first planar bifilar coupled transmission line. In some embodiments, the first and second bifilar coupled transmission lines are substantially identical. The balun further includes a second impedance matching network coupled to both bifilar coupled transmission lines and configured to reduce insertion and return losses of the differential signal at second and third ports of the balun.

It will be appreciated that the techniques described herein may provide improved balun performance including high frequency and high bandwidth operation with low insertion loss, compared to existing baluns that use magnetically coupled transformers or distributed structures. The disclosed techniques can provide improved processing capabilities in a variety of microwave and millimeter-wave RF applications. Numerous embodiments and applications will be apparent in light of this disclosure.

System Architecture

FIG. 1 illustrates an RF system 100 employing a balun 140, in accordance with certain embodiments of the present disclosure. The RF system 100 is shown to include an antenna 110, an amplifier 120, a filter 130, a balun 140, and additional signal processing components 150. The antenna 110, amplifier 120, and filter 130, in this example, operate on (e.g., accept and produce) single-ended signals 160. The additional signal processing components 150, in this example, operate on (e.g., accept and produce) differential signals 170. As such, the balun 140 is employed to convert or transform between the two signal domains, single-ended and differential. In this illustration, the RF system 100 is a receiver system and the signal path flows from the antenna, through the amplifier and filter, to the signal processing components such that the balun transforms the signal from single-ended to differential form. It will be appreciated, however, that in other systems, for example an RF transmitter, the same balun may be employed to transform a differential signal to a single-ended signal.

Figure 2:
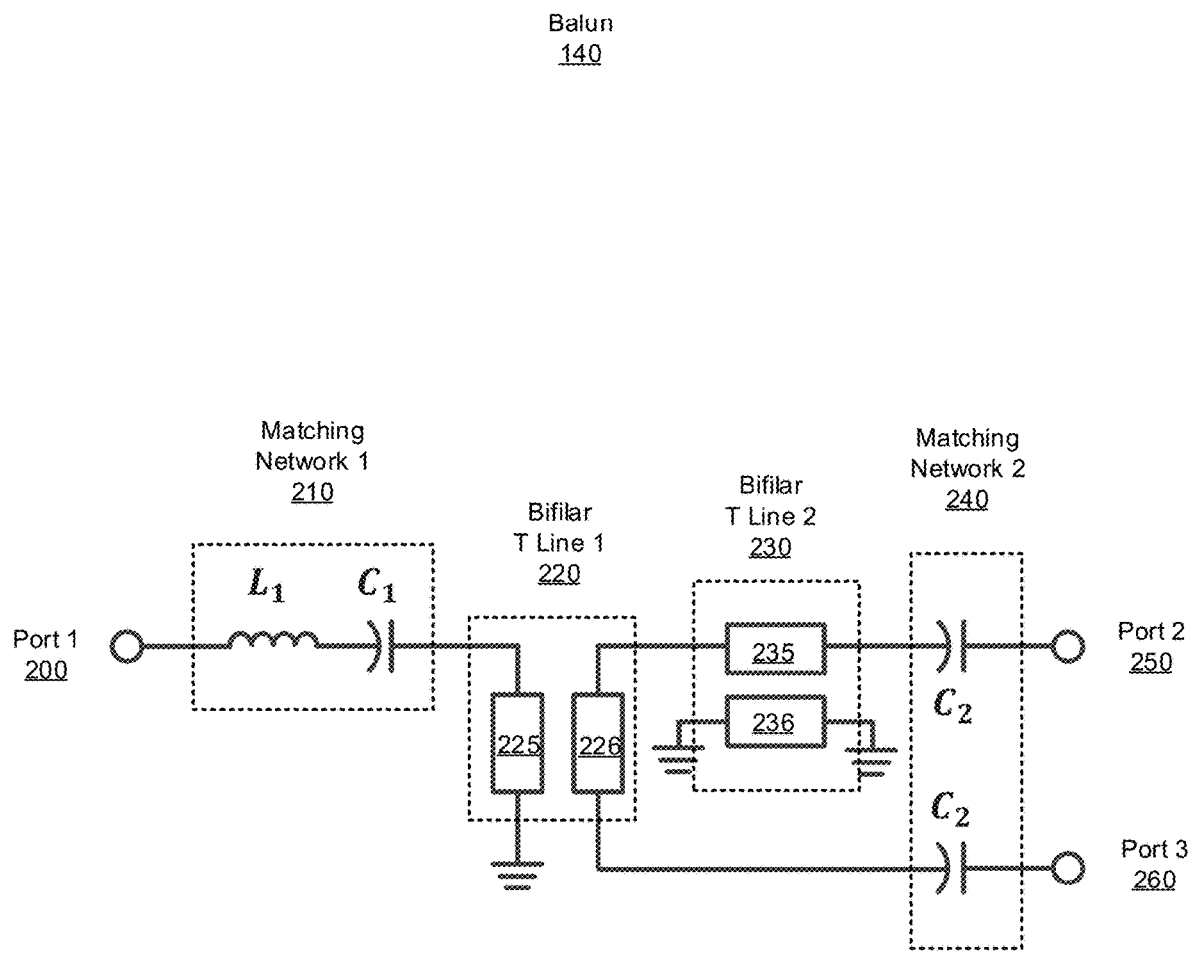
FIG. 2 is a circuit diagram of the balun of FIG. 1, configured in accordance with certain embodiments of the present disclosure.

FIG. 2 is a circuit diagram of the balun 140 of FIG. 1, configured in accordance with certain embodiments of the present disclosure. The balun circuit is shown to include a first port 200, a first impedance matching network 210, a first planar bifilar coupled transmission line 220, a second planar bifilar coupled transmission line 230, a second impedance matching network 240, and second and third ports 250, 260. The following description of the operation of the components of the balun 140 is written from the perspective of transforming a single-ended signal (provided for input at port 1) into a differential signal (to be output at ports 2 and 3), but it will be appreciated that the process works identically in the reverse direction to transform a differential signal (provided for input at ports 2 and 3) into a single-ended signal (to be output at port 1).

The first port 200 is configured to accept a single-ended input signal to the balun 140.

The first impedance matching network 210 is coupled to the first port 200 and is configured to provide impedance matching to reduce the insertion loss and return loss of the single-ended signal at the first port of the balun. In some embodiments, the first impedance matching network 210 comprises an inductor L1 in series with a capacitor C1.

The first planar bifilar coupled transmission line 220 comprises a first winding 225 and a second winding 226 and is configured to transform the single-ended signal into a differential signal, which is to say that it implements power division and creates two output signal paths from a single input. The first winding 225 couples the first impedance matching network 210 to ground. The second winding 226 is coupled between the first winding 235 of the second planar bifilar coupled transmission line 230 and the third port 260, through the second impedance matching network 240.

The second planar bifilar coupled transmission line 230 comprises a first winding 235 and a second winding 236 and is configured to compensate for amplitude and phase imbalance that is induced on the differential signal by the first planar bifilar coupled transmission line 220. The first winding 235 couples the second winding 226 of the first planar bifilar coupled transmission line 220 and the second port 250, through the second impedance matching network 240. The second winding 236 is grounded at both ends.

In some embodiments, the second planar bifilar coupled transmission line 230 is substantially identical to the first planar bifilar coupled transmission line 220 in terms of component size, layout, spacing, and material composition, as will be described in greater detail below. A high degree of similarity between the first and second planar bifilar coupled transmission lines improves the ability to compensate for amplitude and phase imbalance. In some embodiments, amplitude imbalance between the differential signals is reduced to less than 1 dB and phase imbalance (i.e., deviation from ideal value of 180 degrees) is less than 10 degrees.

In some embodiments, lengths of the first and second planar bifilar coupled transmission lines (i.e., the lengths of the windings) are equal to one quarter of the wavelength associated with the frequency that is approximately at the mid-point of the operational frequency range of the balun, which may be designated as extending from a minimum frequency $f_{min}$ in to a maximum frequency $f_{max}$, wherein $f_{min}$ and $f_{max}$ define the bandwidth of the balun (e.g., −3 dB points on the transfer function). In some embodiments, $f_{min}$ is greater than two gigahertz and $f_{max}$ is greater than ten times $f_{min}$.

In some embodiments, the first and second planar bifilar coupled transmission lines are configured to provide an even-mode characteristic impedance (i.e., impedance to common-mode signals) greater than 300 ohms and an odd-mode characteristic impedance (i.e., impedance to differential signals) in the range of 10 to 30 ohms. In some embodiments, the achievable bandwidth of the balun is limited only by the maximum realizable even-mode characteristic impedance of the coupled line pair (windings) while maintaining a relatively low odd-mode characteristic impedance.

In some embodiments, the first and second planar bifilar coupled transmission lines are disposed on an integrated circuit substrate that comprises a ground plane and a portion of the ground plane from a region beneath the planar bifilar coupled transmission lines is removed.

The second impedance matching network 240 couples the first and second planar bifilar coupled transmission lines 220 and 230 to the output ports 260 and 250, respectively, and is configured to provide impedance matching to reduce the insertion loss and return loss of the differential signal at the second and third ports of the balun. In some embodiments, the second impedance matching network 240 comprises capacitors C2 in series with each port.

The second and third ports 250, 260 are configured to provide the differential signal as an output of the balun.

Figure 3:
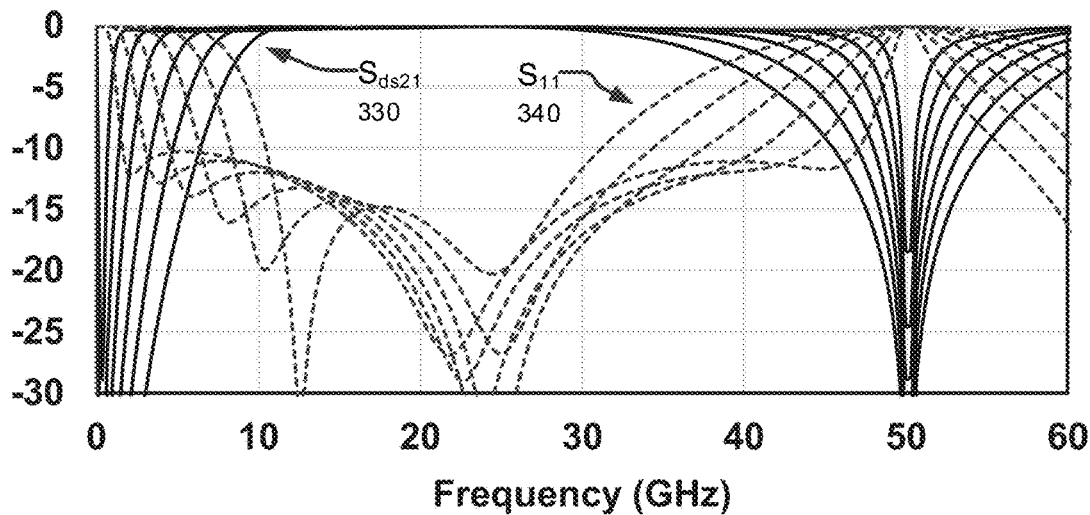
FIG. 3 illustrates the transfer function of the balun of FIG. 2, configured in accordance with certain embodiments of the present disclosure.
Figure 3:
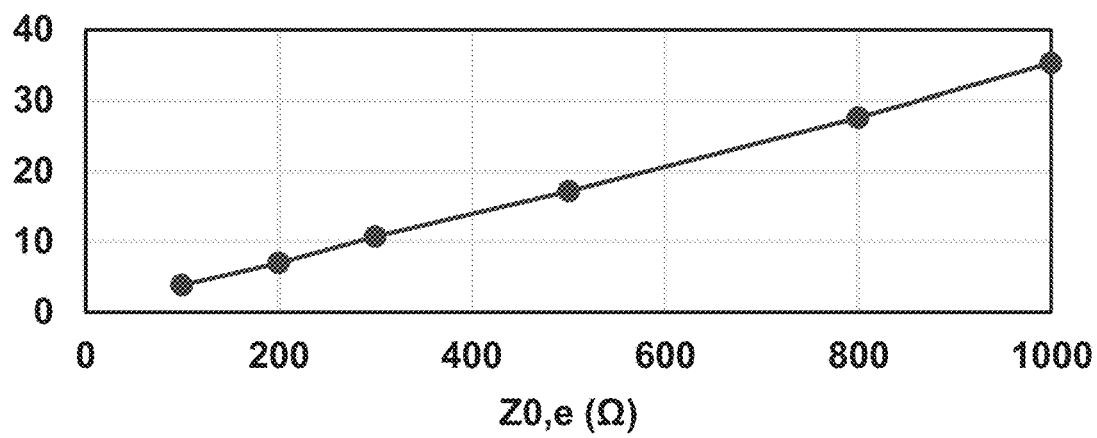

FIG. 3 illustrates the transfer function and bandwidth 300 of the balun 140 of FIG. 2, configured in accordance with certain embodiments of the present disclosure. The top graph illustrates the S-parameters in dB 310 of the balun as a function of frequency 320 over a frequency range of DC (0 Hz) to 60 GHz. The solid lines 330 show $S_{ds21}$, the differential to single-ended transfer function magnitude for each of six even-mode characteristic impedance values (Z0,e), ranging from 100 ohms (which results in the narrowest bandwidth) to 1000 ohms (providing the widest bandwidth). As Z0,e increases, the upper and lower corner frequencies are seen to asymptotically approach 50 GHz and DC respectively.

The top graph also shows, as dashed lines 340, the return loss (or reflection loss) designated $S_{11}$, over that same frequency range. A return loss value below −10 dB is generally considered acceptable, and as can been seen in this graph, the bandwidth over which there is an acceptable return loss also approaches 50 GHz and DC, as Z0,e increases from 100 ohms to 1000 ohms.

The bottom graph illustrates the fractional bandwidth 350 of the balun as a function of the even-mode characteristic impedance (Z0,e) 360 over a range of 100 ohms to 1000 ohms, assuming that odd-mode characteristic impedance (Z0,o) is simultaneously held low (e.g., approximately 20 ohms) to achieve passband impedance matching. Fractional bandwidth is defined here as $f_{max}/f_{min}$, where $f_{max}$ and $f_{min}$ are the −3 dB points of the differential to single-ended transfer function magnitude. As can be seen, the fractional bandwidth increases as Z0,e increases. As seen from these graphs, a fractional bandwidth of 10:1 can be achieved with an even-mode characteristic impedance of 300 ohms.

Figure 4:
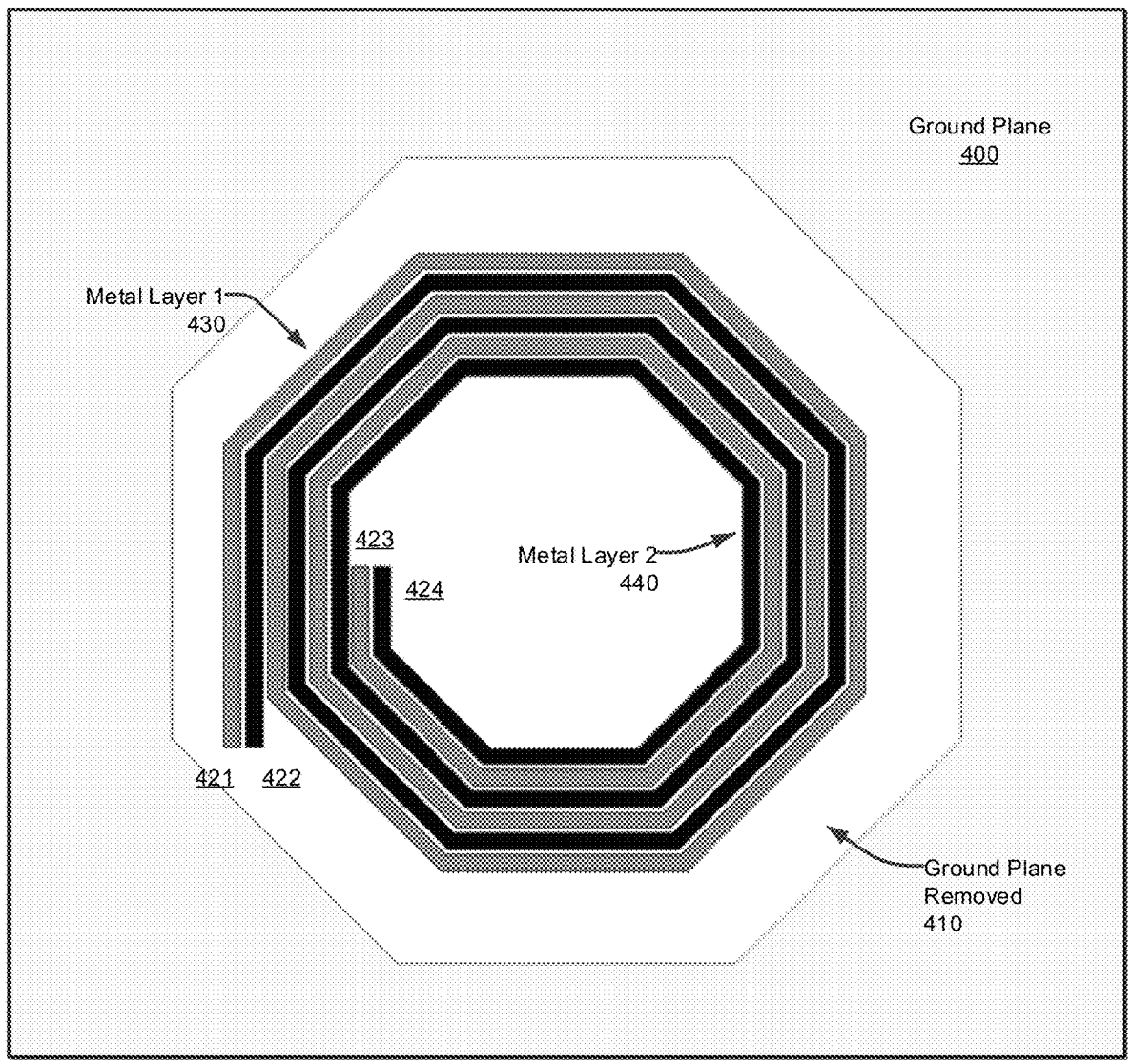
FIG. 4 illustrates the planar bifilar coupled transmission lines of the balun of FIG. 2, configured in accordance with certain embodiments of the present disclosure.

FIG. 4 illustrates the planar bifilar coupled transmission lines 220 and 230 of the balun of FIG. 2, configured in accordance with certain embodiments of the present disclosure. As previously mentioned, the two planar bifilar coupled transmission lines 220 and 230 are substantially identical (e.g., to within fabrication tolerances).

The bifilar coupled transmission line comprises a first metal layer 430, which serves as the first winding 225, 235, and a second metal layer 440, which serves as the second winding 226, 236. The bifilar coupled transmission line is fabricated as a component of an integrated circuit, which is to say that it is a planar structure disposed on a substrate and a ground plane 400. As can be seen, however, the ground plane is removed beneath the metal layers (windings) 430, 440, which helps to reduce the even-mode capacitance per unit length of winding.

In this example embodiment, the first and second windings are parallel to each other and closely spaced (e.g., less than a micrometer). In this example, the windings are laid out in an octagonal shaped coil, although other geometric loops configurations (e.g., a square or circular spiral) can be used. The endpoints of the first winding are labeled 421 and 423, while the endpoints of the second winding are labeled 422 and 424. The endpoints are cross referenced to the schematic representation 450 of the transmission lines 220 and 230, as they appear in the balun circuit diagram of FIG. 2.

The length of each winding is the electrical distance from one endpoint to the other (e.g., the path length from 421 to 423 or from 422 to 424. As previously described, the winding length is configured to approximately equal one quarter of the wavelength corresponding to the mid-frequency of the balun. Other electrical characteristics of the bifilar coupled transmission lines, such as even-mode and odd-mode characteristic impedance are determined, at least in part, by the geometric layout parameters, including the width of the metal layers and the spacing between the metal layers. In particular, the magnetic flux linkage between the first and second windings enhances the even-mode inductance per unit length ($L_E$) in the same manner that a spiral inductor has higher inductance than a straight wire of equal length. Additionally, the even-mode capacitance per unit length ($C_E$) is reduced by removing the ground plane under the coupled windings. These two effects work in tandem to increase the even-mode characteristic impedance Z0,e= $\sqrt{L_E/C_E}$. The odd-mode characteristic impedance Z0,o is determined by controlling the gap/overlap between the two windings which are placed on different metallization layers.

Figure 5:
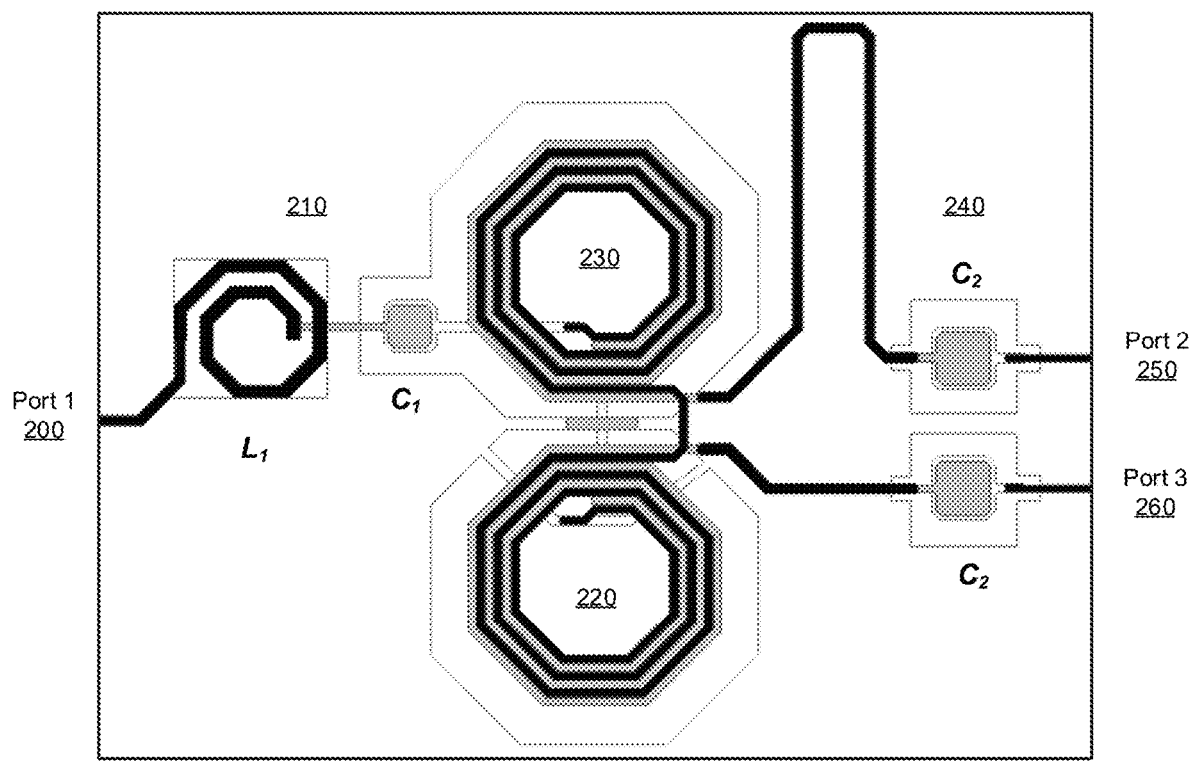
FIG. 5 illustrates an integrated circuit layout of the balun of FIG. 2, in accordance with certain embodiments of the present disclosure.

FIG. 5 illustrates an integrated circuit layout 500 of the balun 140 of FIG. 2, in accordance with certain embodiments of the present disclosure. A representative layout of the components of the balun is shown. The components include the ports 200, 250, 260, the inductor L1 and capacitor C1 of first impedance matching network 210, the first and second planar bifilar coupled transmission lines 220, 230, and the capacitors C2 of second impedance matching network 240.

Methodology

Figure 6:
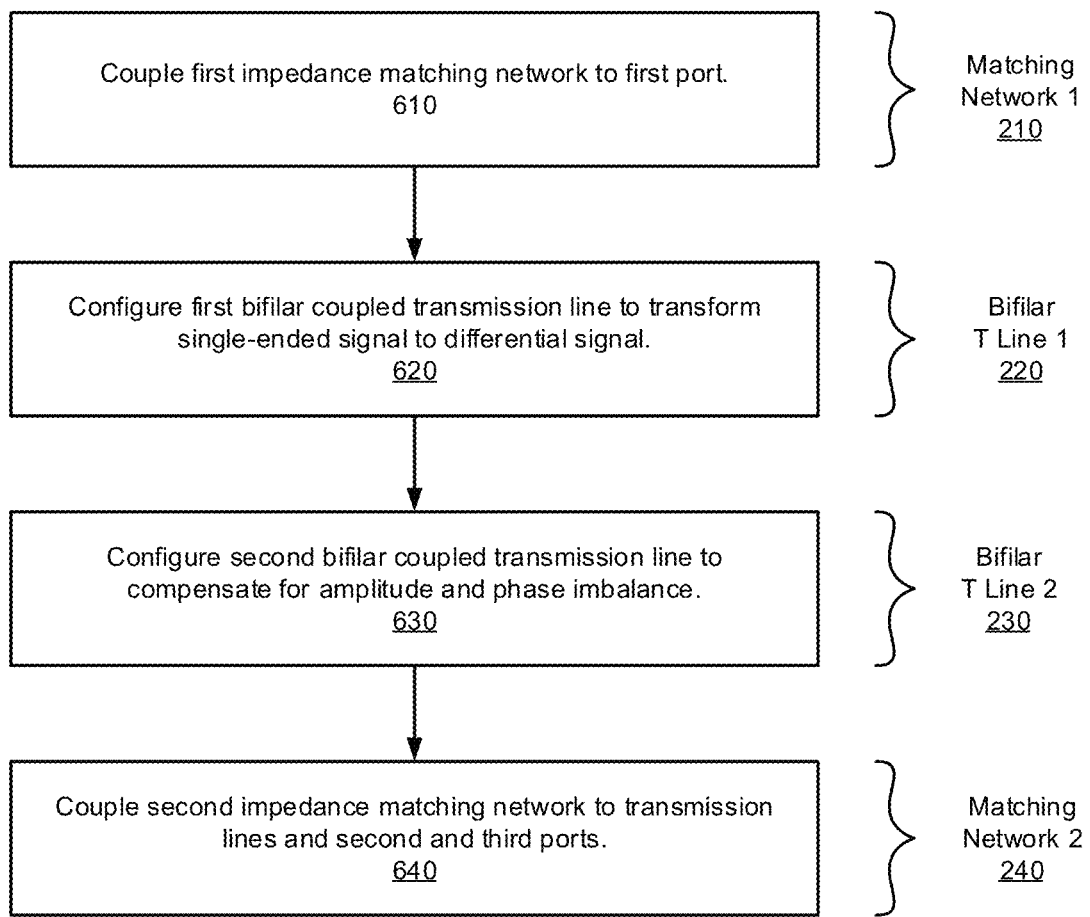
FIG. 6 is a flowchart illustrating a methodology for fabrication of the balun of FIG. 2, in accordance with an embodiment of the present disclosure.

FIG. 6 is a flowchart illustrating a methodology 600 for fabrication of the balun 140 of FIG. 2, in accordance with an embodiment of the present disclosure. As can be seen, example method 600 includes a number of phases and sub-processes, the sequence of which may vary from one embodiment to another. However, when considered in aggregate, these phases and sub-processes form a process for balun fabrication, in accordance with certain of the embodiments disclosed herein, for example as illustrated in FIGS. 2, 4, and 5, as described above. However other system architectures can be used in other embodiments, as will be apparent in light of this disclosure. To this end, the correlation of the various functions shown in FIG. 6 to the specific components illustrated in the figures, is not intended to imply any structural and/or use limitations. Rather other embodiments may include, for example, varying degrees of integration wherein multiple functionalities are effectively performed by one system. Numerous variations and alternative configurations will be apparent in light of this disclosure.

In one embodiment, method 600 commences, at operation 610, by coupling a first impedance matching network to a first port of the balun. The first impedance matching network is configured to reduce insertion and return losses of a single-ended signal at the first port of the balun.

At operation 620, a first planar bifilar coupled transmission line is configured to transform the single-ended signal into a differential signal. The first planar bifilar coupled transmission line is coupled to the first impedance matching network.

At operation 630, a second planar bifilar coupled transmission line is configured to compensate for amplitude and phase imbalance induced on the differential signal by the first planar bifilar coupled transmission line. The second planar bifilar coupled transmission line achieves this compensation by being substantially identical to the first planar bifilar coupled transmission line. The second planar bifilar coupled transmission line is coupled to the first planar bifilar coupled transmission line.

At operation 640, a second impedance matching network is coupled to both the first planar bifilar coupled transmission line and the second planar bifilar coupled transmission line. The second impedance matching network is configured to reduce insertion and return losses of the differential signal at second and third ports of the balun.

Of course, in some embodiments, additional operations may be performed, as previously described in connection with the system. These additional operations may include, for example, configuring the lengths of the first and second planar bifilar coupled transmission lines to be equal to one quarter of a wavelength associated with a frequency that is approximately at the mid-point of the operation frequency range of the balun (e.g., extending from $f_{min}$ to $f_{max}$, where $f_{min}$ and $f_{max}$ define the bandwidth of the balun).

In some embodiments, the operations further comprise configuring the first and second planar bifilar coupled transmission lines to provide an even-mode characteristic impedance greater than 300 ohms and an odd-mode characteristic impedance in the range of 10 to 30 ohms. In some embodiments, the operations further comprise disposing the first and second planar bifilar coupled transmission lines on an integrated circuit substrate that comprises a ground plane and removing a portion of the ground plane from a region beneath the planar bifilar coupled transmission lines.

Some embodiments may be described using the expression "coupled" and "connected" along with their derivatives. These terms are not intended as synonyms for each other. For example, some embodiments may be described using the terms "connected" and/or "coupled" to indicate that two or more elements are in direct physical or electrical contact with each other. The term "coupled," however, may also mean that two or more elements are not in direct contact with each other, but yet still cooperate or interact with each other.

Unless specifically stated otherwise, it may be appreciated that terms such as "processing," "computing," "calculating," "determining," or the like refer to the action and/or process of a computer or computing system, or similar electronic computing device, that manipulates and/or transforms data represented as physical quantities (for example, electronic) within the registers and/or memory units of the computer system into other data similarly represented as physical entities within the registers, memory units, or other such information storage transmission or displays of the computer system. The embodiments are not limited in this context.

The terms "circuit" or "circuitry," as used in any embodiment herein, are functional structures that include hardware, or a combination of hardware and software, and may comprise, for example, singly or in any combination, hardwired circuitry, programmable circuitry such as computer processors comprising one or more individual instruction processing cores, state machine circuitry, and/or gate level logic. The circuitry may include a processor and/or controller programmed or otherwise configured to execute one or more instructions to perform one or more operations described herein. The instructions may be embodied as, for example, an application, software, firmware, etc. configured to cause the circuitry to perform any of the aforementioned operations. Software may be embodied as a software package, code, instructions, instruction sets and/or data recorded on a computer-readable storage device. Software may be embodied or implemented to include any number of processes, and processes, in turn, may be embodied or implemented to include any number of threads, etc., in a hierarchical fashion. Firmware may be embodied as code, instructions or instruction sets and/or data that are hard-coded (e.g., nonvolatile) in memory devices. The circuitry may, collectively or individually, be embodied as circuitry that forms part of a larger system, for example, an integrated circuit (IC), an application-specific integrated circuit (ASIC), a system-on-a-chip (SoC), desktop computers, laptop computers, tablet computers, servers, smartphones, etc. Other embodiments may be implemented as software executed by a programmable device. In any such hardware cases that include executable software, the terms "circuit" or "circuitry" are intended to include a combination of software and hardware such as a programmable control device or a processor capable of executing the software. As described herein, various embodiments may be implemented using hardware elements, software elements, or any combination thereof. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth.

Numerous specific details have been set forth herein to provide a thorough understanding of the embodiments. It will be understood, however, that other embodiments may be practiced without these specific details, or otherwise with a different set of details. It will be further appreciated that the specific structural and functional details disclosed herein are representative of example embodiments and are not necessarily intended to limit the scope of the present disclosure. In addition, although the subject matter has been described in language specific to structural features and/or methodological acts, it is to be understood that the subject matter defined in the appended claims is not necessarily limited to the specific features or acts described herein. Rather, the specific features and acts described herein are disclosed as example forms of implementing the claims.

Further Example Embodiments

The following examples pertain to further embodiments, from which numerous permutations and configurations will be apparent.

One example embodiment of the present disclosure provides a balanced-to-unbalanced transformer (balun) comprising: a first impedance matching network coupled to a first port of the balun; a first planar bifilar coupled transmission line coupled to the first impedance matching network, the first planar bifilar coupled transmission line configured to transform the single-ended signal into a differential signal; a second planar bifilar coupled transmission line coupled to the first planar bifilar coupled transmission line; and a second impedance matching network coupled to the first planar bifilar coupled transmission line and the second planar bifilar coupled transmission line.

In some cases, the lengths of the first planar bifilar coupled transmission line and the second planar bifilar coupled transmission line are equal to one quarter of a wavelength associated with a frequency that is approximately at a mid-point in a frequency range extending from fmin to fmax, wherein fmin and fmax define the bandwidth of the balun. In some such cases, fmin is greater than two gigahertz and fmax is greater than ten times fmin. In some cases, the first planar bifilar coupled transmission line and the second planar bifilar coupled transmission line are configured to provide an even-mode characteristic impedance greater than 300 ohms. In some cases, the first planar bifilar coupled transmission line and the second planar bifilar coupled transmission line are configured to provide an odd-mode characteristic impedance in the range of 10 to 30 ohms. In some cases, the balun is disposed on an integrated circuit substrate that comprises a ground plane, and a portion of the ground plane is removed from a region beneath the first planar bifilar coupled transmission line and the second planar bifilar coupled transmission line. In some cases, the first impedance matching network comprises an inductor coupled in series with a first capacitor, and the second impedance matching network comprises a second capacitor coupled in series with the second port and a third capacitor coupled in series with the third port. In some cases, the second planar bifilar coupled transmission line is configured to compensate for amplitude and phase imbalance induced on the differential signal by the first planar bifilar coupled transmission line.

Another example embodiment of the present disclosure provides a method for fabricating a balanced-to-unbalanced transformer (balun), the method comprising: coupling a first impedance matching network to a first port of the balun, the first impedance matching network configured to reduce insertion loss and return loss of a single-ended signal at the first port of the balun; configuring a first planar bifilar coupled transmission line to transform the single-ended signal into a differential signal and coupling the first planar bifilar coupled transmission line to the first impedance matching network; configuring a second planar bifilar coupled transmission line to compensate for amplitude and phase imbalance induced on the differential signal by the first planar bifilar coupled transmission line and coupling the second planar bifilar coupled transmission line to the first planar bifilar coupled transmission line; and coupling a second impedance matching network to the first planar bifilar coupled transmission line and the second planar bifilar coupled transmission line, the second impedance matching network configured to reduce insertion loss and return loss of the differential signal at second and third ports of the balun.

In some cases, the method further comprises configuring lengths of the first planar bifilar coupled transmission line and the second planar bifilar coupled transmission line to equal one quarter of a wavelength associated with a frequency that is approximately at a mid-point in a frequency range extending from fmin to fmax, wherein fmin and fmax define the bandwidth of the balun. In some such cases, fmin is greater than two gigahertz and fmax is greater than ten times fmin. In some cases, the method further comprises configuring the first planar bifilar coupled transmission line and the second planar bifilar coupled transmission line to provide an even-mode characteristic impedance greater than 300 ohms. In some cases, the method further comprises configuring the first planar bifilar coupled transmission line and the second planar bifilar coupled transmission line to provide an odd-mode characteristic impedance in the range of 10 to 30 ohms. In some cases, the method further comprises disposing the balun on an integrated circuit substrate that includes a ground plane and removing a portion of the ground plane from a region beneath the first planar bifilar coupled transmission line and the second planar bifilar coupled transmission line.

Another example embodiment of the present disclosure provides a radio frequency (RF) signal processing system comprising: a first RF component configured to operate on a single-ended signal; a second RF component configured to operate on a differential signal; and a balanced-to-unbalanced transformer (balun) to couple the first RF component to the second RF component, wherein the balun includes a first impedance matching network coupled to a first port of the balun, the first impedance matching network configured to reduce insertion loss and return loss of a single-ended signal at the first port of the balun, a first planar bifilar coupled transmission line coupled to the first impedance matching network, the first planar bifilar coupled transmission line configured to transform the single-ended signal into a differential signal, a second planar bifilar coupled transmission line coupled to the first planar bifilar coupled transmission line, the second planar bifilar coupled transmission line configured to compensate for amplitude and phase imbalance induced on the differential signal by the first planar bifilar coupled transmission line, and a second impedance matching network coupled to the first planar bifilar coupled transmission line and the second planar bifilar coupled transmission line, the second impedance matching network configured to reduce insertion loss and return loss of the differential signal at second and third ports of the balun.

In some cases, lengths of the first planar bifilar coupled transmission line and the second planar bifilar coupled transmission line are equal to one quarter of a wavelength associated with a frequency that is approximately at a mid-point in a frequency range extending from fmin to fmax, wherein fmin and fmax define the bandwidth of the balun. In some such cases, fmin is greater than two gigahertz and fmax is greater than ten times fmin. In some cases, the first planar bifilar coupled transmission line and the second planar bifilar coupled transmission line are configured to provide an even-mode characteristic impedance greater than 300 ohms. In some cases, the first planar bifilar coupled transmission line and the second planar bifilar coupled transmission line are configured to provide an odd-mode characteristic impedance in the range of 10 to 30 ohms. In some cases, the balun is disposed on an integrated circuit substrate that comprises a ground plane, and a portion of the ground plane is removed from a region beneath the first planar bifilar coupled transmission line and the second planar bifilar coupled transmission line.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be appreciated in light of this disclosure. The present disclosure should, therefore, be considered to encompass such combinations, variations, and modifications. It is intended that the scope of the present disclosure be limited not by this detailed description, but rather by the claims appended hereto. Future filed applications claiming priority to this application may claim the disclosed subject matter in a different manner and may generally include any set of one or more elements as variously disclosed or otherwise demonstrated herein.

What is claimed is:

1. A balanced-to-unbalanced transformer (balun) comprising:
   a first impedance matching network coupled to a first port of the balun;
   a first planar bifilar coupled transmission line coupled to the first impedance matching network, the first planar bifilar coupled transmission line configured to transform a single-ended signal into a differential signal, wherein the first planar bifilar coupled transmission line comprises a first winding and a second winding;
   a second planar bifilar coupled transmission line coupled to the first planar bifilar coupled transmission line, wherein the first planar bifilar coupled transmission line and the second planar bifilar coupled transmission line are configured to provide an even-mode characteristic impedance greater than 300 ohms, wherein the second planar bifilar transmission line comprises a first winding and a second winding;
   a second impedance matching network coupled to the first planar bifilar coupled transmission line and the second planar bifilar coupled transmission line;
   wherein the first winding of the first planar bifilar transmission line couples the first impedance matching network to ground, the second winding of the first planar bifilar transmission line couples the first winding of the second planar bifilar coupled transmission line to a second port through the second impedance matching network; and wherein the first winding of the second planar bifilar coupled transmission line couples the second winding of the first planar bifilar coupled transmission line and a third port through the second impedance matching network and wherein the second winding of the second planar bifilar coupled transmission line is grounded at both ends.

2. The balun of claim 1, wherein lengths of the first planar bifilar coupled transmission line and the second planar bifilar coupled transmission line are equal to one quarter of a wavelength associated with a frequency that is approximately at a mid-point in a frequency range extending from fmin to fmax, wherein fmin and fmax define the bandwidth of the balun.

3. The balun of claim 2, wherein fmin is greater than two gigahertz and fmax is greater than ten times fmin.

4. The balun of claim 1, wherein the first planar bifilar coupled transmission line and the second planar bifilar coupled transmission line are configured to provide an odd-mode characteristic impedance in the range of 10 to 30 ohms.

5. The balun of claim 1, wherein the balun is disposed on an integrated circuit substrate that comprises a ground plane, and a portion of the ground plane is removed from a region beneath the first planar bifilar coupled transmission line and the second planar bifilar coupled transmission line.

6. The balun of claim 1, wherein the first impedance matching network comprises an inductor coupled in series with a first capacitor, and the second impedance matching network comprises a second capacitor coupled in series with the second port and a third capacitor coupled in series with the third port.

7. The balun of claim 1, wherein the second planar bifilar coupled transmission line is configured to compensate for amplitude and phase imbalance induced on the differential signal by the first planar bifilar coupled transmission line.

8. A method for fabricating a balanced-to-unbalanced transformer (balun), the method comprising:

coupling a first impedance matching network to a first port of the balun, the first impedance matching network configured to reduce insertion loss and return loss of a single-ended signal at the first port of the balun;

configuring a first planar bifilar coupled transmission line to transform the single-ended signal into a differential signal and coupling the first planar bifilar coupled transmission line to the first impedance matching network, wherein the first planar bifilar coupled transmission line comprises a first winding and a second winding;

configuring a second planar bifilar coupled transmission line to compensate for amplitude and phase imbalance induced on the differential signal by the first planar bifilar coupled transmission line and coupling the second planar bifilar coupled transmission line to the first planar bifilar coupled transmission line, wherein the second planar bifilar transmission line comprises a first winding and a second winding;

coupling a second impedance matching network to the first planar bifilar coupled transmission line and the second planar bifilar coupled transmission line, the second impedance matching network configured to reduce insertion loss and return loss of the differential signal at second and third ports of the balun; and configuring the first planar bifilar coupled transmission line and the second planar bifilar coupled transmission line to provide an even-mode characteristic impedance greater than 300 ohms;

wherein the first winding of the first planar bifilar transmission line couples the first impedance matching network to ground, the second winding of the first planar bifilar transmission line couples the first winding of the second planar bifilar coupled transmission line to a second port through the second impedance matching network; and wherein the first winding of the second planar bifilar coupled transmission line couples the second winding of the first planar bifilar coupled transmission line and a third port through the second impedance matching network and wherein the second winding of the second planar bifilar coupled transmission line is grounded at both ends.

9. The method of claim 8, further comprising configuring lengths of the first planar bifilar coupled transmission line and the second planar bifilar coupled transmission line to equal one quarter of a wavelength associated with a frequency that is approximately at a mid-point in a frequency range extending from fmin to fmax, wherein fmin and fmax define the bandwidth of the balun.

10. The method of claim 9, wherein fmin is greater than two gigahertz and fmax is greater than ten times fmin.

11. The method of claim 8, further comprising configuring the first planar bifilar coupled transmission line and the second planar bifilar coupled transmission line to provide an odd-mode characteristic impedance in the range of 10 to 30 ohms.

12. The method of claim 8, further comprising disposing the balun on an integrated circuit substrate that includes a ground plane and removing a portion of the ground plane from a region beneath the first planar bifilar coupled transmission line and the second planar bifilar coupled transmission line.

13. A radio frequency (RF) signal processing system comprising:

a first RF component configured to operate on a single-ended signal;

a second RF component configured to operate on a differential signal; and a balanced-to-unbalanced transformer (balun) to couple the first RF component to the second RF component, wherein the balun includes:

a first impedance matching network coupled to a first port of the balun, the first impedance matching network configured to reduce insertion loss and return loss of the single-ended signal at the first port of the balun, a first planar bifilar coupled transmission line coupled to the first impedance matching network, the first planar bifilar coupled transmission line configured to transform the single-ended signal into a differential signal, wherein the first planar bifilar coupled transmission line comprises a first winding and a second winding;

a second planar bifilar coupled transmission line coupled to the first planar bifilar coupled transmission line, the second planar bifilar coupled transmission line configured to compensate for amplitude and phase imbalance induced on the differential signal by the first planar bifilar coupled transmission line, wherein the first planar bifilar coupled transmission line and the second planar bifilar coupled transmission line are configured to provide an even-mode characteristic impedance greater than 300 ohms, wherein the second planar bifilar transmission line comprises a first winding and a second winding; and a second impedance matching network coupled to the first planar bifilar coupled transmission line and the second planar bifilar coupled transmission line, the second impedance matching network configured to reduce insertion loss and return loss of the differential signal at second and third ports of the balun;

wherein the first winding of the first planar bifilar transmission line couples the first impedance matching network to ground, the second winding of the first planar bifilar transmission line couples the first winding of the second planar bifilar coupled transmission line to a second port through the second impedance matching network; and wherein the first winding of the second planar bifilar coupled transmission line couples the second winding of the first planar bifilar coupled transmission line and a third port through the second impedance matching network and wherein the second winding of the second planar bifilar coupled transmission line is grounded at both ends.

14. The RF signal processing system of claim 13, wherein lengths of the first planar bifilar coupled transmission line and the second planar bifilar coupled transmission line are equal to one quarter of a wavelength associated with a frequency that is approximately at a mid-point in a frequency range extending from fmin to fmax, wherein fmin and fmax define the bandwidth of the balun.

15. The RF signal processing system of claim 14, wherein fmin is greater than two gigahertz and fmax is greater than ten times fmin.

16. The RF signal processing system of claim 13, wherein the first planar bifilar coupled transmission line and the second planar bifilar coupled transmission line are configured to provide an odd-mode characteristic impedance in the range of 10 to 30 ohms.

17. The RF signal processing system of claim 13, wherein the balun is disposed on an integrated circuit substrate that comprises a ground plane, and a portion of the ground plane is removed from a region beneath the first planar bifilar coupled transmission line and the second planar bifilar coupled transmission line.

* * * * *